(12) United States Patent
Wilson et al.

(10) Patent No.: US 6,956,416 B2
(45) Date of Patent: Oct. 18, 2005

(54) POWERUP CONTROL OF PLL

(75) Inventors: James Wilson, Foxboro, MA (US); Lew Lahr, Dover, MA (US); Stuart Patterson, East Walpole, MA (US); Daniel Boyko, Norwood, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/786,584

(22) Filed: Feb. 25, 2004

(65) Prior Publication Data

US 2005/0184772 A1 Aug. 25, 2005

(51) Int. Cl.$^7$ .............................................. H03L 7/06
(52) U.S. Cl. ..................... 327/156; 327/158; 331/10; 331/177 R
(58) Field of Search ............................. 327/156, 158, 327/159; 331/10, 14, 17, 177 R, 185

(56) References Cited

U.S. PATENT DOCUMENTS

| | | | | |
|---|---|---|---|---|
| 5,334,952 A | * | 8/1994 | Maddy et al. | 331/1 A |
| 5,420,545 A | * | 5/1995 | Davis et al. | 331/17 |
| 5,978,425 A | * | 11/1999 | Takla | 375/374 |
| 5,986,514 A | * | 11/1999 | Salvi et al. | 331/17 |
| 6,078,634 A | * | 6/2000 | Bosshart | 375/376 |
| 6,396,890 B1 | * | 5/2002 | Turner | 375/376 |
| 6,597,249 B2 | * | 7/2003 | Chien et al. | 331/177 R |
| 6,806,781 B2 | * | 10/2004 | Bisanti et al. | 331/36 R |

* cited by examiner

*Primary Examiner*—Timothy P. Callahan
*Assistant Examiner*—An T. Luu
(74) *Attorney, Agent, or Firm*—Wolf, Greenfield & Sacks, PC (57) ABSTRACT

An electronic device, such as a microprocessor, with a timing circuit. The timing circuit contains a phase locked loop that, during a first interval, checks whether a control signal in the phase locked loop is between a maximum allowed value and a minimum allowed value. When the control signal in the phase locked loop is above a maximum allowed value or below a minimum allowed value, the control circuit disables the phase locked loop for a second interval. When the control signal in the phase locked loop is below a maximum allowed value and above a minimum allowed value, the timing circuit indicates that the output of the phase locked loop is stable.

27 Claims, 9 Drawing Sheets

POWERUP CONTROL OF PLL

BACKGROUND OF INVENTION

1. Field of Invention

This invention relates generally to electronic devices and more specifically to clock or timing circuitry for use in such devices.

2. Discussion of Related Art

Computer data processors are widely used in modern electronic systems. For example, most desktop computers are built around a microprocessor chip. The microprocessor chip is a computer data processor that can be programmed to perform many data processing functions. Microprocessors perform arithmetic operations or logical operations that can be combined into many types of programs, such as those used to do accounting or word processing.

Other computer data processors are designed for specialized functions. One example is a digital signal processor (DSP). A digital signal processor is kind of microprocessor that is configured to quickly perform complex mathematical operations used in processing digitized signals (e.g. audio or video signals).

Figure 1:
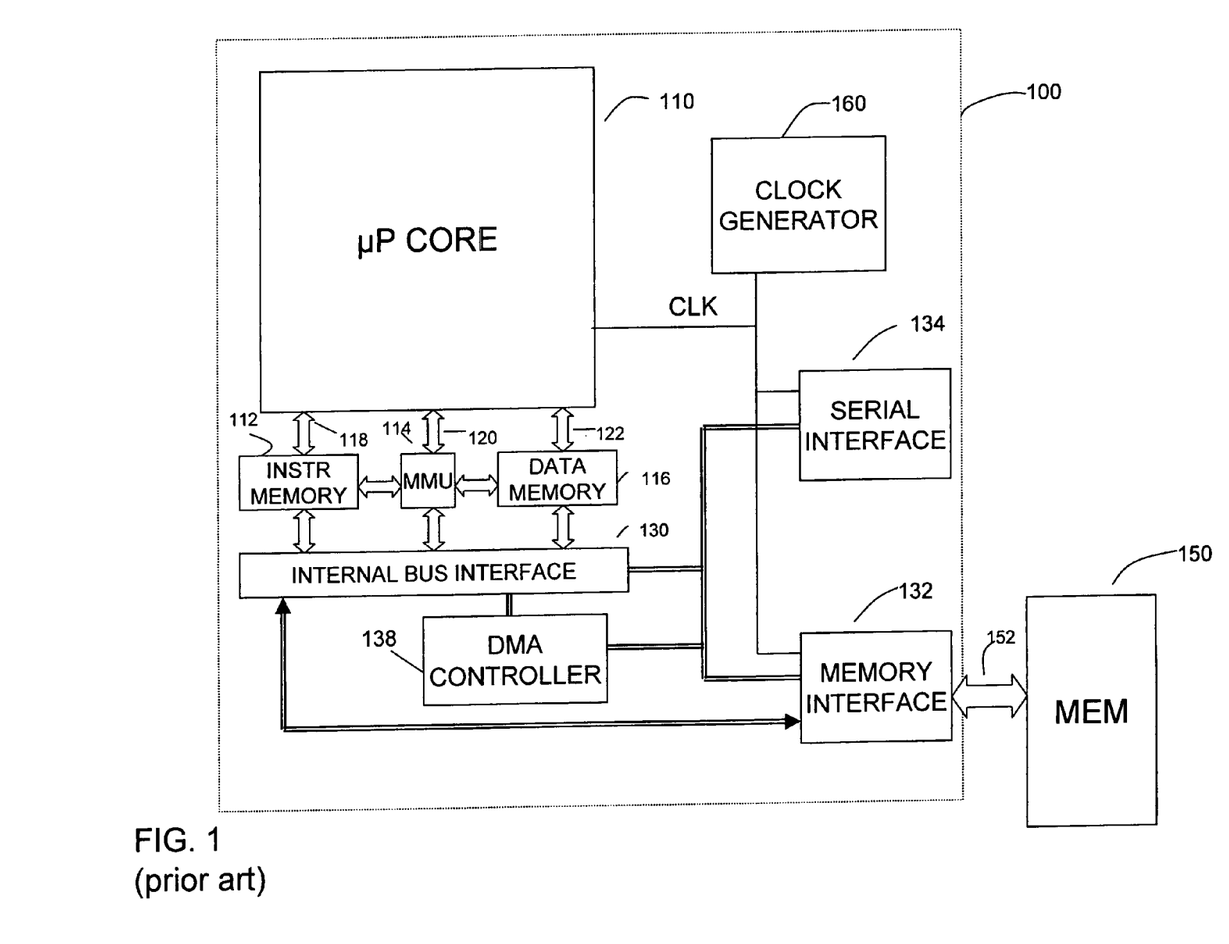
FIG. 1 is a simplified block diagram of a processor chip using a clock generator as in the prior art.

FIG. 1 shows a high-level block diagram of a computer data processor. FIG. 1 could represent a general purpose computer data processor or it could represent a special purpose data processor, such as a digital signal processor. FIG. 1 illustrates a processor chip 100. Within processor chip 100 is a microprocessor core 110. In operation, microprocessor core 110 reads instructions from memory and then performs functions dictated by the instruction. In many cases, these instructions operate on data that is also stored. When an operation performed by microprocessor core 110 manipulates data, the data is read from memory and new data is generally stored in memory after the instruction is executed.

FIG. 1 shows that processor chip 100 includes an on-chip instruction memory unit 112 and an on-chip data memory unit 116. Both the instruction memory unit 112 and data memory unit 116 are controlled by a memory management unit 114. Instruction memory unit 112 and data memory unit 116 each contain memory that stores information accessed by microprocessor core 110 as instructions or data, respectively.

Integrated circuit 100 also includes a memory interface 122 that can read or write instructions or data in memory 150. Memory 150 is off-chip memory.

It is traditional for a processor chip to contain a clock generator 160 that generates a clock, CLK. The CLK signal provides timing to circuitry in the microprocessor core and related circuitry. In some instances, multiple clocks of different frequencies or phases are derived from the CLK signal to satisfy timing requirements of various components. In other instances, clock generator 160 can be programmed to change the frequency or phase of CLK signal.

Figure 2:
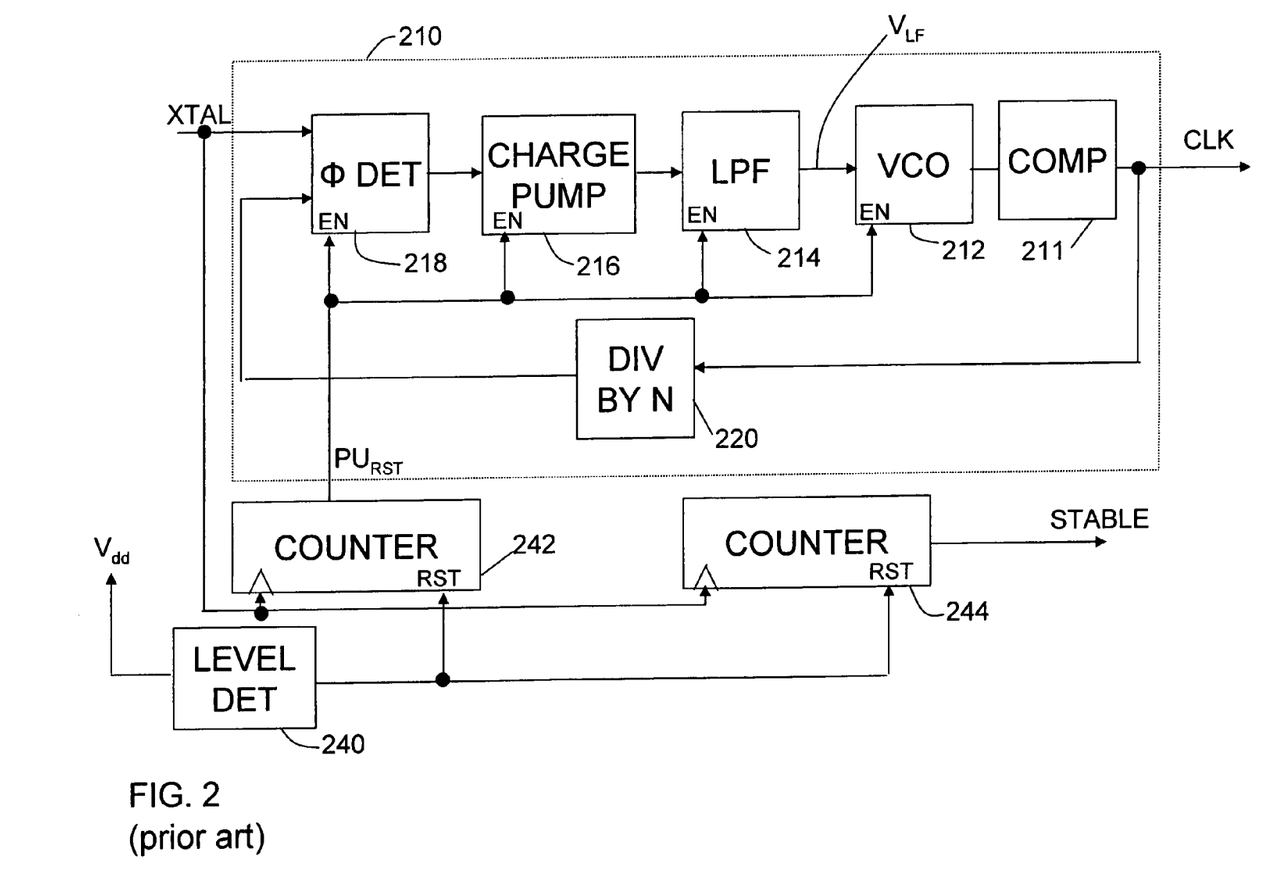
FIG. 2 is a block diagram showing a portion of the circuitry within a prior art clock generator of FIG. 1.

Many clock generators derive timing signals from a phase locked loop. FIG. 2 shows in block diagram form circuitry that can be contained within clock generator 160. The circuitry of FIG. 2 uses a phase locked loop (PLL) 210 to generate the CLK signal. Phase locked loop 210 includes a voltage controlled oscillator (VCO) 212. Many designs for voltage controlled oscillators are known. One such design involves a ring oscillator where the delay for a signal propagating around a ring can be controlled and establishes the frequency of oscillation.

The output of VCO 212 is provided to comparator 211, which converts the output of the VCO 212 into a digital signal. The digital signal out of comparator 211 is provided to divide-by-N counter 220. The value of N is usually programmable.

The output of divide-by-N counter 220 is provided to a phase detector 218. The second input (XTAL) of phase detector 218 is obtained from an oscillator, often a crystal. Phase detector 218 compares the output of divide-by-N counter 220 with the output of the crystal oscillator. When the two signals are equal, the output of phase detector 218 is zero. In this condition, the phase locked loop is said to be "locked".

The locked condition occurs when VCO 212 is producing an output that has a frequency N times the frequency of the crystal. By varying N, a clock of a controllable frequency can be produced.

The output of phase detector 218 is used in a negative feedback loop to drive VCO 212 to the locked condition. The output of phase detector 218 is provided to charge pump 216. Charge pump 216 produces a control voltage. The output of charge pump 216 is filtered by low pass filter 214 and then applied as a control input to voltage control oscillator 212. When the loop is not "locked," the output of phase detector 218 should, in "normal" operating states, change the control voltage so that VCO 212 changes its output frequency and phase to more closely match the frequency and phase of the XTAL input. Eventually, the output of VCO 212 will be driven to a state where the loop should become locked.

A phase locked loop provides a convenient way to generate relatively stable timing signals of controllable frequency. However, when first turned on or when its operation is disrupted, a phase locked loop requires time to reach a locked state. The process of a loop becoming locked is sometimes called "settling." During the settling interval, the output of the phase locked loop might not be at the desired frequency or might vary in phase. Accordingly, it is usual for a timing circuit to include a delay element that inhibits use of the phase locked loop output by other sub-circuits in the digital system until a settling time has passed.

Thus, pursuant to the prior art, FIG. 2 shows use of a level detect circuit 240 that produces an output indicating that the power supply voltage, $V_{dd}$, has risen above some level that should be acceptable for operation of the phase locked loop circuitry. In turn, the output of level detect circuit 240 is used to reset counters 242 and 244, both of which are clocked by the XTAL signal, when $V_{dd}$ is acceptable. The output of counter 242 then enables the phase locked loop.

It is undesirable for the phase locked loop to run before the supply voltage exceeds an appropriate level. In normal operation, the negative feedback loop in the phase locked loop should drive the loop to "lock" in the desired stable condition. However, if the appropriate power supply level is not supplied to the phase locked loop, the loop might not operate properly and might instead "lock" in an unintended operating state. By delaying operation of the loop when power is first applied until a time when the power supply voltage should have reached an appropriate level, chances of the loop locking in an unintended state are reduced.

Circuitry of FIG. 2 provides these delays. The output of counter 242 is indicated as a signal named $PU_{RST}$. When asserted (e.g. placed in a logical high state), the PURST signal indicates that a predetermined amount of time has passed since detection of some minimum $V_{dd}$ level. The output of counter 244 enables other circuitry in integrated circuit 100. Counter 244 produces the ENABLE output some time after the phase locked loop 210 has been enabled. Counter 244 counts long enough (i.e. an interval predetermined by the circuit designer) that the output of phase locked loop 210 should be stable at the time the remaining circuitry within integrated circuit 100 is enabled.

It would be desirable to further reduce the chances of the timing circuitry of an electronic circuit, such as an integrated circuit containing a microprocessor core, from producing unintended operating states. That is, a need exists for a clock generation circuit that performs even more reliably.

SUMMARY OF INVENTION

In one aspect, the invention comprises an electronic device having a clock generation circuit with a phase locked loop generating a control signal and having a clock output and an enable input enabling operation of the phase locked loop when a first value is applied to the enable input and disabling the phase locked loop when a second value is applied to the enable input. A control circuit has an output connected to the enable input. The control circuit comprises a first sub-circuit, receiving the control signal and producing an output indicating the condition of the control signal; a second sub-circuit, coupled to the clock output of the phase locked loop, that detects a pulse and produces an output indicating that a pulse is present during a first interval of time; and a third sub-circuit, having inputs coupled to the first sub-circuit and the second sub-circuit and an enable output, the third sub-circuit, when at least one of the control voltage and the pulse are not detected at the end of the first interval of time, provides an enable input to the phase locked loop with the second value and maintains the enable input with the second value for a second interval of time and thereafter provides the enable input the first value for at least a third interval of time.

In another aspect, the invention comprises a method of operating a timing circuit having a phase locked loop. During a first interval, a check is made whether a control signal in the phase locked loop is between a maximum allowed value and a minimum allowed value. When the control signal in the phase locked loop is above a maximum allowed value or below a minimum allowed value, the phase locked loop is disabled for a second interval. When the control signal in the phase locked loop is below a maximum allowed value and above a minimum allowed value, indicating that the output of the phase locked loop is stable.

In another aspect, the invention comprises a method of operating a timing circuit comprising a phase locked loop. The method involves, during a first interval, detecting whether a control voltage in the phase locked loop is above a threshold and at least one pulse is produced from the output of the phase locked loop. When the control voltage in the phase locked loop is not above a threshold and at least one pulse is produced from the output of the phase locked loop, the phase locked loop is disabled for a second interval. When the control voltage in the phase locked loop is above a threshold and at least one pulse is produced from the output of the phase locked loop, an indication that the output of the phase locked loop is stable is produced.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

We have discovered that, despite circuitry to impose delays such as is shown in the timing circuit of FIG. 2, a timing circuit containing a phase locked loop might enter an unintended operating state. For example, process variations in CMOS devices might result in as much as a thirty-percent difference in operating characteristics from chip to chip. Therefore, a circuit such as level detector 240 might not always work as intended. While the circuit might be designed very conservatively to compensate for design variability. However, such conservative design imposes a considerable cost an performance sacrifice.

The foregoing needs are met in a phase locked loop with circuitry that resets the loop if improper operation is detected. In a preferred embodiment, the circuitry monitors the loop control voltage and loop output to determine whether proper operation is occurring. The circuit includes timing signals that ensure the loop is not reset as it is powering up and, when reset, a sufficient time has passed to ensure that charge has dissipated in the loop to increase the likelihood that normal operation will result.

Figure 3A:
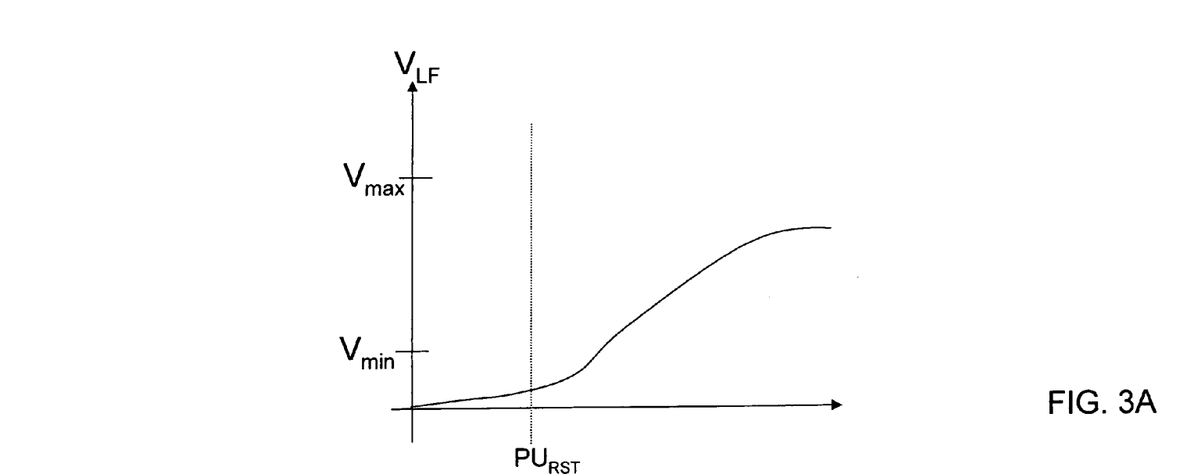
FIGS. 3A, 3B and 3C are sketches illustrating an error condition that could occur in the clock generation circuit of the prior art.

FIG. 3A, which shows the control voltage within phase locked loop 210, $V_{LF}$, illustrates a possible error condition. For phase locked loop 210 to work properly, the control voltage $V_{LF}$ should be between a minimum and maximum value, which are denoted $V_{min}$ and $V_{max}$, respectively.

At powerup, the signal $PU_{RST}$ that enables operation of the loop should ideally be asserted at a time when the loop control voltage $V_{LF}$ is between the minimum and maximum allowed values. FIG. 3A shows that the control signal $PU_{RST}$ is asserted before the voltage exceeds the minimum value. Such a condition might occur, for example, if level detector 240 indicated a sufficient supply voltage when the supply voltage was actually too low for proper operation of the phase locked loop 210.

Figure 3B:
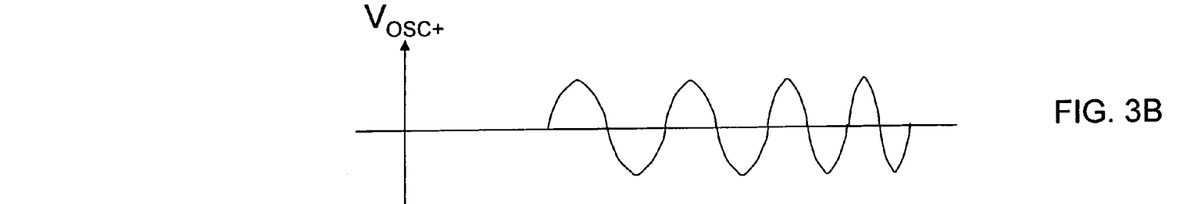
Figure 3C:
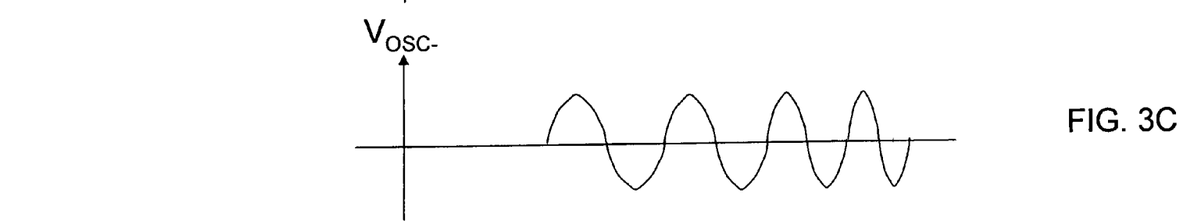

We have observed an error condition as shown in FIGS. 3B and 3C that can occur in the situation illustrated by FIG. 3A. In the illustrated embodiment, VCO 212 generates a differential signal appearing on two wires that can be denoted $V_{OSC+}$ and $V_{OSC-}$. $V_{OSC+}$ is shown in FIG. 3B. $V_{OSC-}$ is shown in FIG. 3C. When the phase locked loop 210 is operating normally, $V_{OSC+}$ and $V_{OSC-}$ will be virtually identical although 180° out of phase from each other.

FIGS. 3B and 3C show that, though oscillation is occurring at the output of VCO 212, $V_{OSC+}$ and $V_{OSC-}$ are not 180° degrees out of phase. In the extreme condition shown in FIGS. 3B and 3C, the two signals are in phase, with no differential mode signal. Comparator 211—which treats $V_{OSC+}$ and $V_{OSC-}$ as a unitary differential signal—responds to the signals shown in FIGS. 3B and 3C as if they have a zero value.

Phase detector 218 will generate an output indicating that the loop is not oscillating. This output indicates that VCO 212 should increase its frequency. However, increasing the control voltage on VCO 212 does not bring the signals $V_{OSC+}$ and $V_{OSC-}$ into the appropriate phase relationship. Thus, no change in the control voltage within phase locked loop 210 will cause the loop to operate normally. In this state, the loop is not locked to the input oscillator signal and is stuck in an unintended operating state. Consequently, the loop can be said to have "crashed".

Figure 4A:
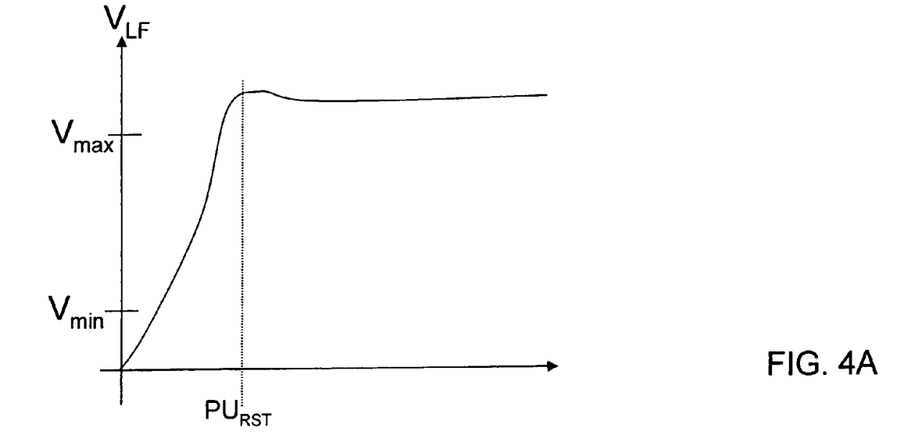
FIGS. 4A, 4B and 4C are sketches of an error condition that could occur in a clock generation circuit as in the prior art.
Figure 4B:
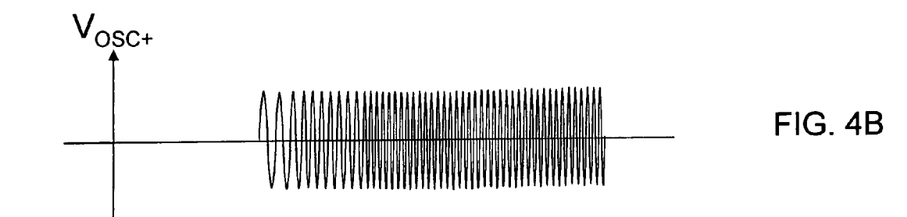
Figure 4C:
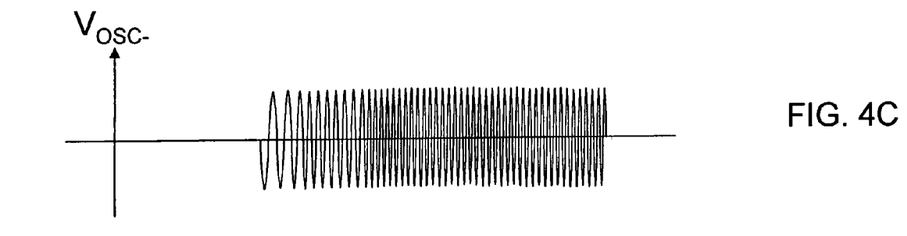

FIGS. 4A, 4B, and 4C show a different scenario in which loop 210 might crash. In FIG. 4A, the loop control voltage $V_{LF}$ is shown to have exceeded a permissible maximum value when the loop is enabled by the signal PURST. FIGS. 4B and 4C show separately the differential components associated with the output of phase locked loop 210. In these figures, $V_{OSC+}$ and $V_{OSC-}$ are 180 degrees out of phase. However, because the control voltage is very high, these signals are shown to oscillate very quickly. The period of oscillation of these signals is faster than the response time of the digital circuitry in phase locked loop 210. For example, comparator 211 will not reliably recognize the signals $V_{OSC+}$ and $V_{OSC-}$ as oscillating signals.

Because comparator 211 does not recognize oscillations in its input signal, it will produce an output consistent with an input that has no or very slow oscillations. Phase detector 218 will therefore produce an output signal indicating that the control voltage into VCO 212 should be increased. Rather than bringing the output of VCO 212 into the desired operating range, the frequency of VCO 212 will be forced to and stuck at a frequency that is too high. In this state, phase locked loop 210 has also "crashed".

Counters 242 and 244 as shown in FIG. 2 do not avoid either of these crash conditions. Counter 242 will eventually assert the STABLE signal and the rest of the circuitry in integrated circuit chip 100 will begin operation with a clock having incorrect operating characteristics, creating unreliable operation.

Figure 5:
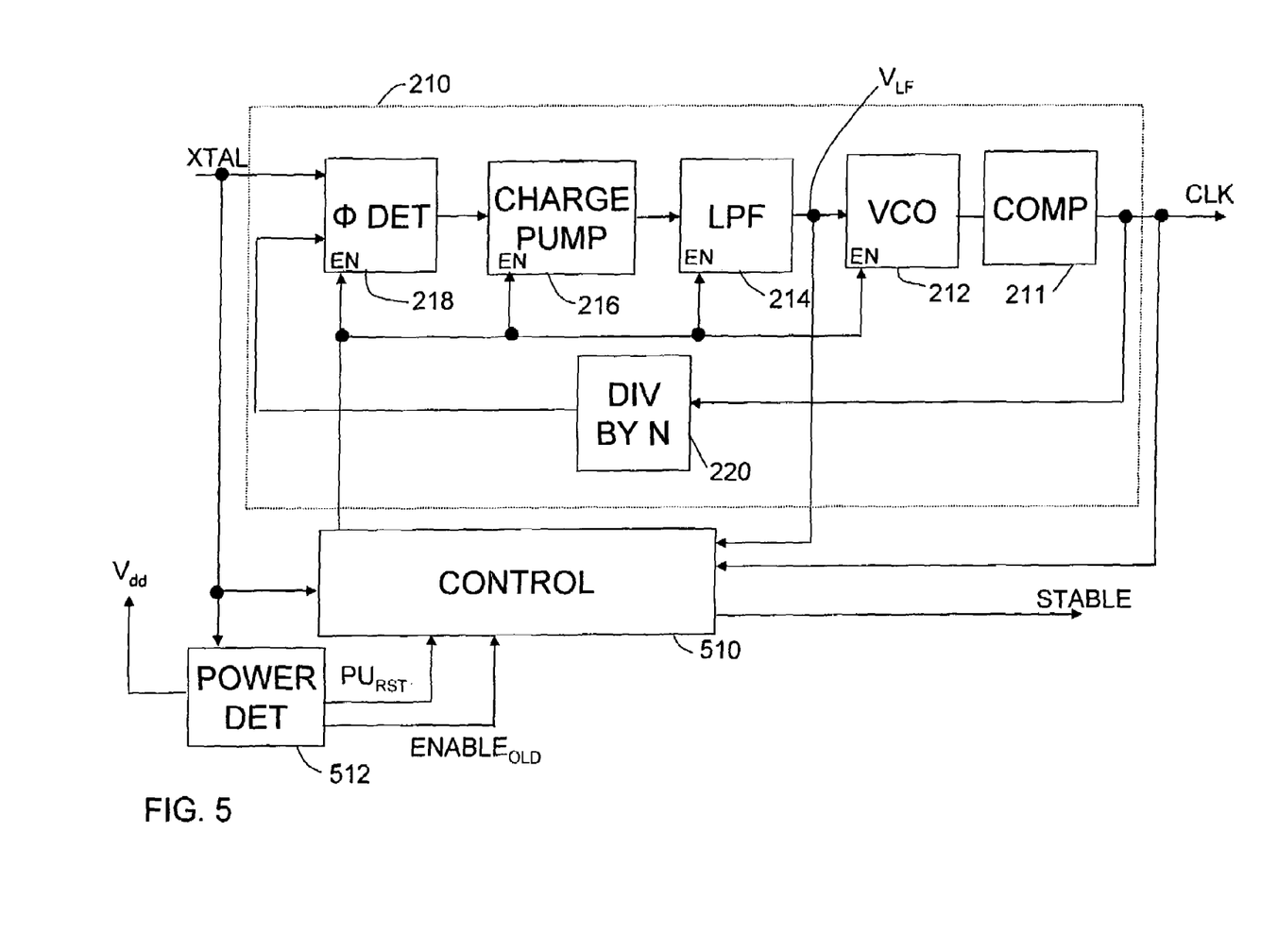
FIG. 5 is a block diagram of a clock generation circuit incorporating the invention.

FIG. 5 shows an improved phase locked loop that avoids the error conditions of FIGS. 3 and 4. FIG. 5 shows a phase locked loop 210 that includes a phase detector 218, a charge pump 216, a low-pass filter 214, a VCO 212, a comparator 211 and a divide-by-N counter 220. Phase detector 218, charge pump 216, low-pass filter 214, VCO 212, comparator 211 and divide-by-N counter 220 can be constructed as in the prior art.

As shown in FIG. 2, each of the analog elements—i.e., phase detector 218, charge pump 216, low pass filter 214, and VCO 212—have an input for receiving the ENABLE signal. When the ENABLE signal is asserted, phase locked loop 210 will operate. When the ENABLE signal is deasserted, these analog elements do not operate and also discharge any stored charge they might have within them.

The ENABLE signal supplied to the analog elements in phase locked loop 210 is provided by a control circuit 510, which is explained in greater detail in connection with FIG. 9 below. Control circuit 510 also provides as an output a signal denoted STABLE, which can be used by microprocessor core 110 (FIG. 1) or other digital elements within integrated circuit chip 100. As in the prior art, the STABLE signal indicates that the phase locked loop 210 has reached a stable condition and the clock output of the phase locked loop can be used for timing digital circuits.

Control circuit 510 receives as an input $V_{LF}$. $V_{LF}$ is the control voltage to the VCO 212. Control circuit 510 also receives an input XTAL from the oscillator, not shown. As in the prior art, the XTAL input is used for timing control functions.

In the preferred embodiment, control circuit 510 keeps the phase locked loop disabled for a predetermined interval after power is supplied. In the illustrated embodiment, control circuit 510 also receives an input $PU_{RST}$ from a power-up detector circuit 512. Power-up detector circuit 512 can be a level detector such as 240 and a counter 242 as in the prior art shown in FIG. 2. Power-up detector circuit 512 asserts output $PU_{RST}$ a defined time after supply voltage $V_{dd}$ reaches a threshold.

Control circuit 510 also receives feedback from the output of phase locked loop 210. In operation, control circuit 510 ensures that phase locked loop 210 is in stable, valid operating condition before it asserts the STABLE signal to allow digital circuitry elsewhere in semiconductor chip 100 to operate. Where control circuit 510 determines that phase lock 210 is not properly operating, it deasserts the ENABLE signal to phase locked loop 210 for a period of time calculated to allow any stored charge within the analog elements in phase locked loop 210 to dissipate.

When the ENABLE signal is reasserted, phase locked loop 210 should stabilize in an allowed operating state. However, control circuit 510 continuously monitors the operating state of phase locked loop 210. At any time when control circuit 510 detects an incorrect operating condition, control circuit 510 deasserts the STABLE signal and again deasserts the ENABLE signal supplied as an input to the phase locked loop 210. In this way, control circuit 510 ensures that phase locked loop 210 powers up and remains in an allowed operating state.

If phase locked loop 210 has crashed, control circuit 510 resets the phase locked loop and allows it to stabilize in an allowed operating condition. In a preferred embodiment, control circuit 510 operates on the principle that the control voltage $V_{LF}$ in phase locked loop 210 will be between an allowed minimum and an allowed maximum value when phase locked loop 210 is operating correctly. Control voltage $V_{LF}$ is fed to control circuit 510, allowing control circuit 510 to detect whether $V_{LF}$ is in the allowed range.

A possible implementation of control circuit 510 could include a window comparator or two analog comparators each of which has as an input $V_{LF}$. One comparator could compare $V_{LF}$ to an allowed minimum value and one comparator could compare $V_{LF}$ to an allowed maximum value. However, analog comparators require more space in integrated circuit 100 than digital logic.

In the illustrated embodiment, only one analog comparator is used to detect whether the control voltage $V_{LF}$ has reached the minimum allowed value. Control circuit 510 infers that $V_{LF}$ has not exceeded the allowed maximum using simple digital logic circuitry. In the illustrated embodiment, control circuit 510 contains a circuit that detects whether the output CLK of phase locked loop 210 contains pulses. As described above, if the control voltage is too high, the output of the phase locked loop might oscillate, but the oscillations will be so high in frequency that they will not be recognized by digital circuitry connected to the output or they will cause unplanned and perhaps erratic responses. If the control voltage $V_{LF}$ exceeds the minimum value and the digital circuitry is able to detect pulses at the output of the phase locked loop, it can be inferred that the control voltage $V_{LF}$ is in the allowed range.

Figure 6:
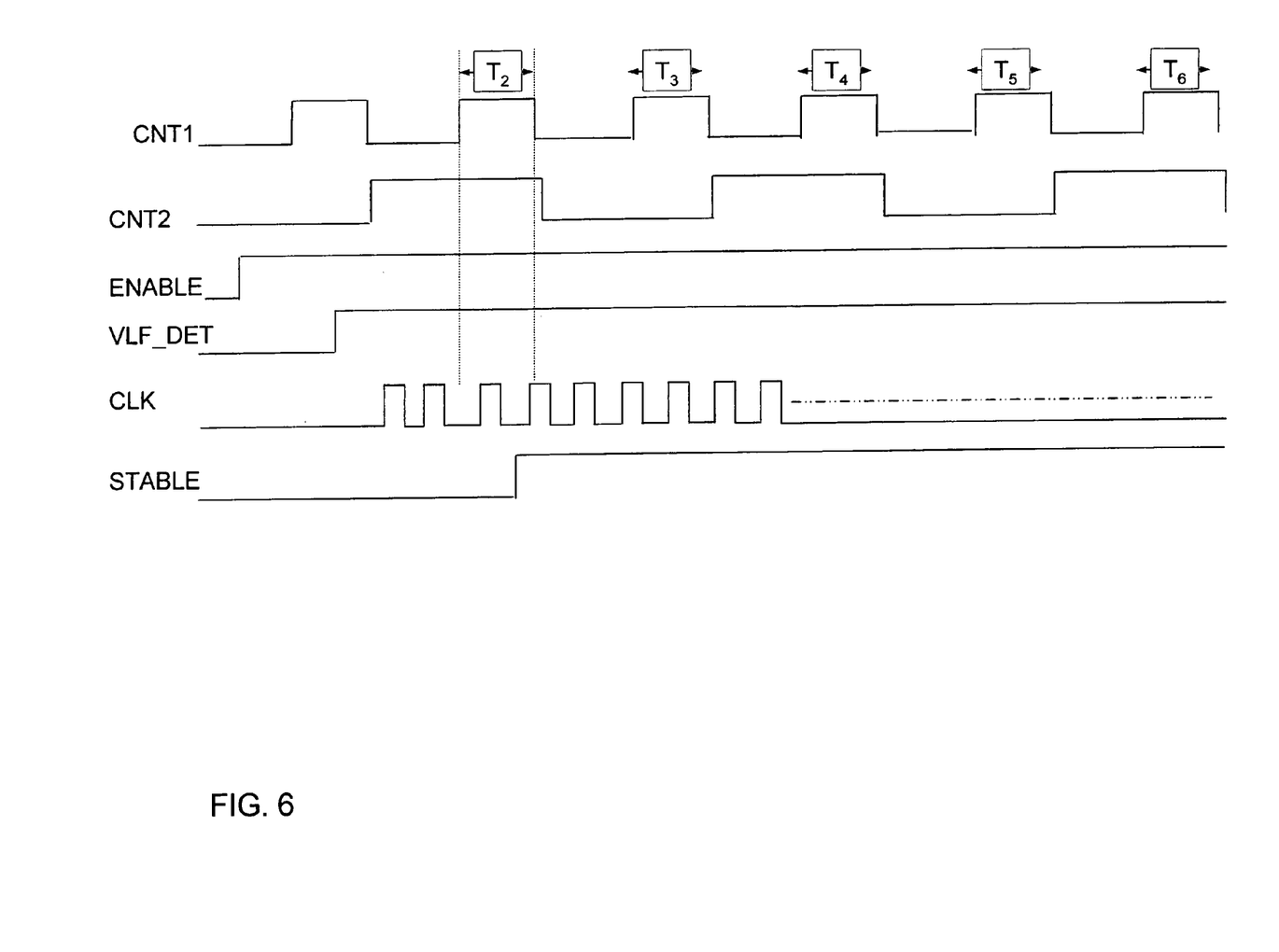
FIG. 6 is a timing diagram useful and understanding the circuit of FIG. 5.

FIG. 6 shows a timing diagram illustrating the operation of control circuit 510. FIG. 6 shows two clock signals CNT1 and CNT2. These clock signals are derived from the XTAL input. Preferably, each is derived by counting some number of pulses of the XTAL input. In a preferred embodiment, CNT1 is derived by counting 512 pulses of the XTAL input and CNT2 is derived by counting 1024 pulses of the XTAL input. However, the precise number of pulses counted is not critical to the invention.

The next line in the timing diagram of FIG. 6 shows the ENABLE signal provided by control circuit 510 to the analog elements of phase locked loop 210. The ENABLE signal is initially asserted a predetermined amount of time after the supply voltage $V_{dd}$ is detected. Initial assertion of the ENABLE signal can be controlled by the $PU_{RST}$ signal. For the condition shown in FIG. 6, phase locked loop 210 does not crash. Rather it enters a stable operating state. Therefore, the ENABLE signal stays asserted.

The next line in the timing diagram shows a signal VLF_DET. This signal indicates the output of a subcircuit within control circuit 510 that detects a control voltage above a predetermined threshold. By way of example, this threshold is approximately 0.3 volts in some processes. However, the threshold corresponding to the minimum control voltage will depend on the specific implementation of phase locked loop 210. It will depend both on the technology used to implement the phase locked loop and also the specific arrangement of circuitry within VCO 212 and its response to a control input. As can be seen in FIG. 6, the signal VLF_DET is asserted shortly after the ENABLE signal. Such a signal corresponds to a normal operating state of phase locked loop 212.

The next line in timing diagram of FIG. 6 indicates the output CLK of phase locked loop 210. In the normal operating states depicted in FIG. 6, the CLK output begins to oscillate shortly after the ENABLE signal is applied and the control voltage is detected.

Control circuit 510 periodically checks for a normal operating state of phase locked loop 210. In the preferred embodiment, a normal operating state is defined by a loop control voltage exceeding a minimum value and at least one pulse being detected. Control circuit 510 checks for these conditions during each pulse of CNT1. As seen in FIG. 6, the loop control voltage exceeds the minimum and the pulse is detected first in the interval indicated $T_2$. As a result, the STABLE output is asserted at the end of the interval $T_2$.

Control circuit 510 repeats the same check in each of the subsequent intervals $T_3, T_4, T_5 \ldots$ For the normal operating conditions depicted in FIG. 6, in each of these subsequent intervals phase locked loop 210 continues to be in a normal operating mode. The normal operating state is apparent in FIG. 6 by the fact that the signal VLF_DET continues to be asserted and the output CLK continues to contain pulses.

Figure 7:
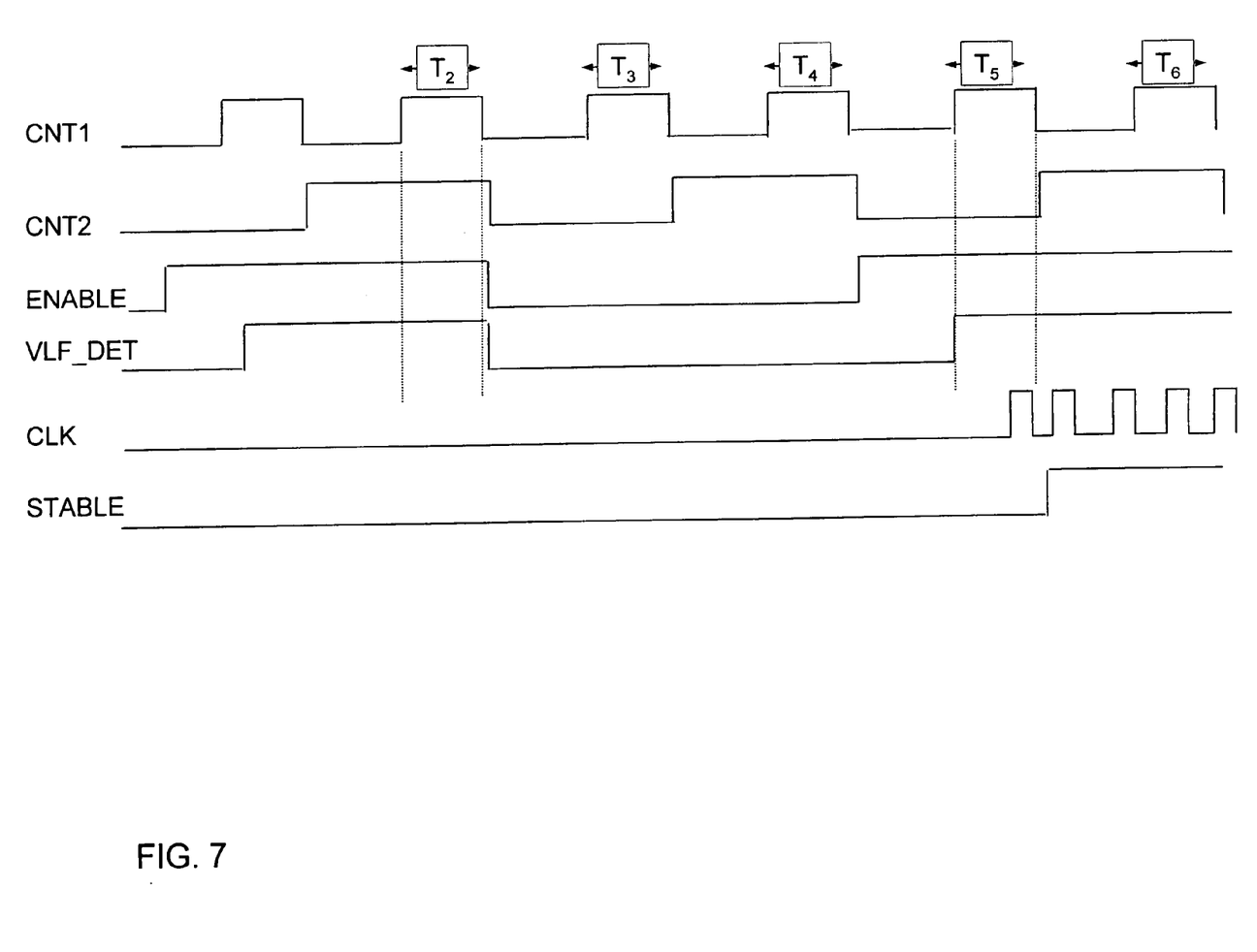
FIG. 7 is a timing diagram useful and understanding the operation of the circuit of FIG. 5.

FIG. 7 shows an operating condition in which phase locked loop 210 does not immediately powerup in a normal operating condition. The signals CNT1 and CNT2 are the same as shown in FIG. 6. The ENABLE signal also starts out the same as in FIG. 6. The ENABLE signal is asserted a predetermined time after the supply voltage is detected. As in FIG. 6, the loop control voltage is also detected shortly after phase locked loop 210 is enabled.

Unlike in normal operating state depicted in FIG. 6, no pulse at the output CLK of phase locked loop 210 is detected during the interval $T_2$. As a result, the STABLE output is not asserted after the period $T_2$. Because phase locked loop 210 is not in a normal operating state at the end of period $T_2$, control circuit 510 de-enables the input.

The ENABLE output is deasserted after period $T_2$. The ENABLE output stays deasserted for one period of CNT2. During this time, any charge built up in the analog elements of phase locked loop 210 is dissipated. As a result, when phase locked loop is re-enabled, the analog elements of the loop will be in a known state. From this state, phase locked loop 210 should enter a normal operating mode. As shown in FIG. 7, the ENABLE input is reasserted following period $T_4$. Shortly after the ENABLE output is reasserted, the loop control voltage $V_{LF}$ exceeds the minimum value, as indicated by VLF_DET being asserted.

In period $T_5$, control circuit 510 checks again for normal operation of phase locked loop 210. Period $T_5$ should occur sufficiently after period $T_4$ that the loop has had time to settle. During interval $T_5$ the signal VLF_DET is asserted and the output CLK contains a pulse. Accordingly, control circuit 510 identified that phase locked loop 210 is in a normal operating state during interval $T_5$. At the end of interval $T_5$, the STABLE signal is asserted, enabling digital components clocked by the output of phase locked loop 210 to operate.

Figure 8:
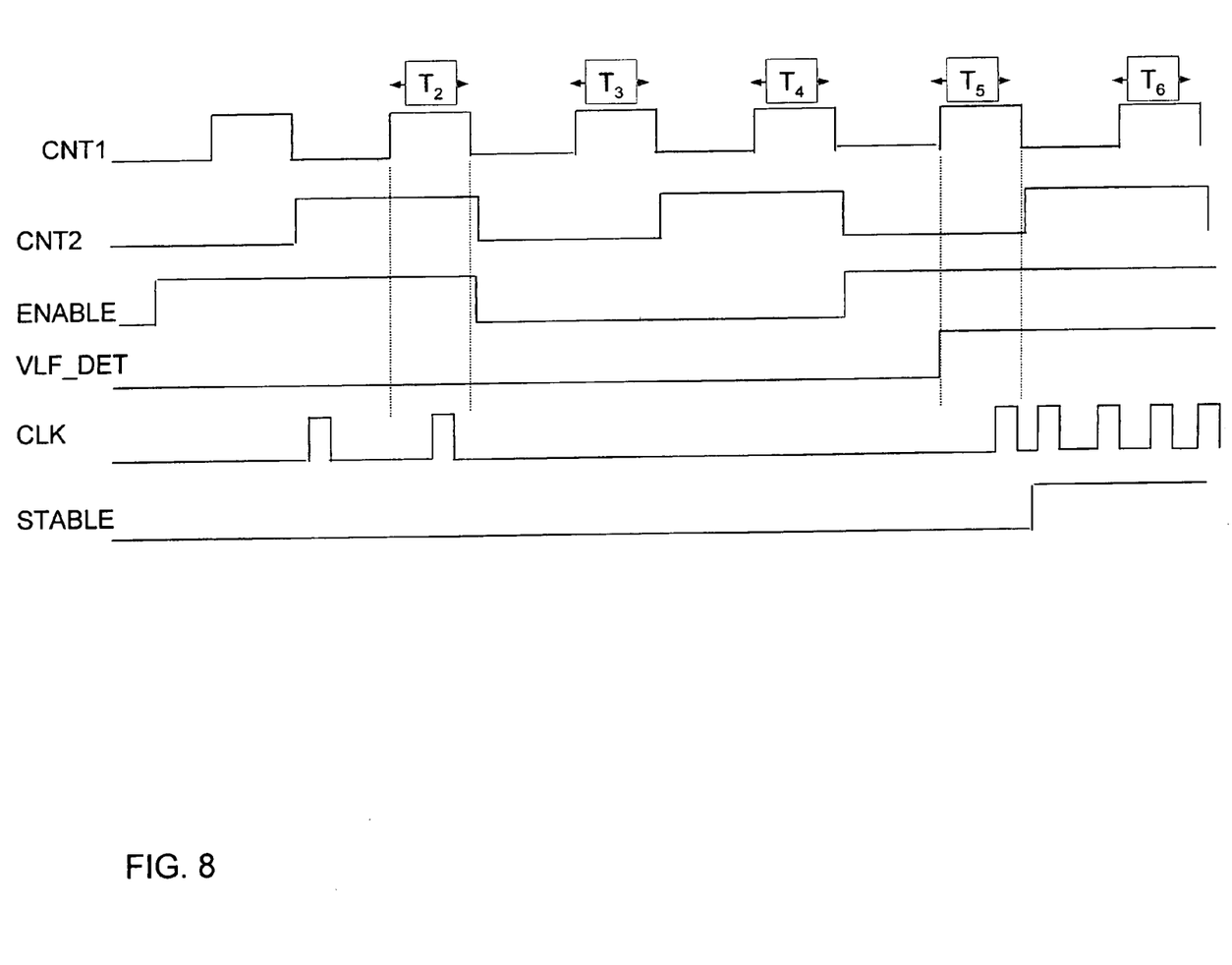
FIG. 8 is a timing diagram useful in understanding the operation of the circuit in FIG. 5.

Turning to FIG. 8, a second example of how control circuit 510 can cause phase locked loop 210 to recover from a crashed state is presented. In FIG. 8, the signal CNT1 and CNT2 are the same as in the prior figures. Also, the ENABLE input is asserted when a supply voltage exceeding a threshold is detected.

FIG. 8 illustrates an error condition in which the loop control voltage does not initially exceed the minimum allowed value. The CLK line in FIG. 8 shows initially spurious pulses at the output of phase locked loop 210. Even though one of these pulses occurs during the period $T_2$, control circuit 510 does not equate the spurious pulse with normal operation of phase locked loop 210. During the period $T_2$, because the loop control voltage has not exceeded the minimum value, control circuit 510 identifies loop 210 to be in improper operating state. Consequently, the ENABLE output is deasserted at the end of period $T_2$.

As in FIG. 7 where an improper operating condition was detected, the ENABLE output is deasserted for one period of clock CNT2. Thereafter, the ENABLE output is reasserted. In this example, the analog components of phase locked loop 210 enter a known state while the ENABLE output is deasserted. Consequently, when the ENABLE output is reasserted, the loop control voltage rises above the minimum allowed value for proper operation. In this condition, the CLK output begins to oscillate in a regular pattern. During interval $T_5$ control circuit 510 detects normal operation of phase locked loop 210. Following the interval $T_5$ the STABLE output is asserted.

The examples of FIG. 7 and FIG. 8 illustrate conditions in which the phase locked loop 210 does not initially enter proper operating mode. Deasserting the ENABLE input for one period of CNT2 operates as a reset of phase locked loop 210. In the examples shown in both FIG. 7 and FIG. 8, phase locked loop 210 enters a normal operating state after one reset of phase locked loop 210. In a preferred embodiment, however, if the first reset of the loop does not result in normal operation of the loop control circuit 510 will continue to reset phase locked loop 210 until normal operation is detected.

Also, it should be appreciated that FIG. 7 and FIG. 8 illustrate a loop crash upon powerup. However, control circuit 510 checks for proper operation of phase locked loop 210 during every period of clock CNT1 that the loop is enabled. Therefore, if loop 210 enters an improper operating state after it has powered up normally, control circuit 510, in the preferred embodiment, will deassert the stable output and reset the loop. When after the loop is reset and a stable operation of the loop is detected, the STABLE output will be reasserted.

Figure 9:
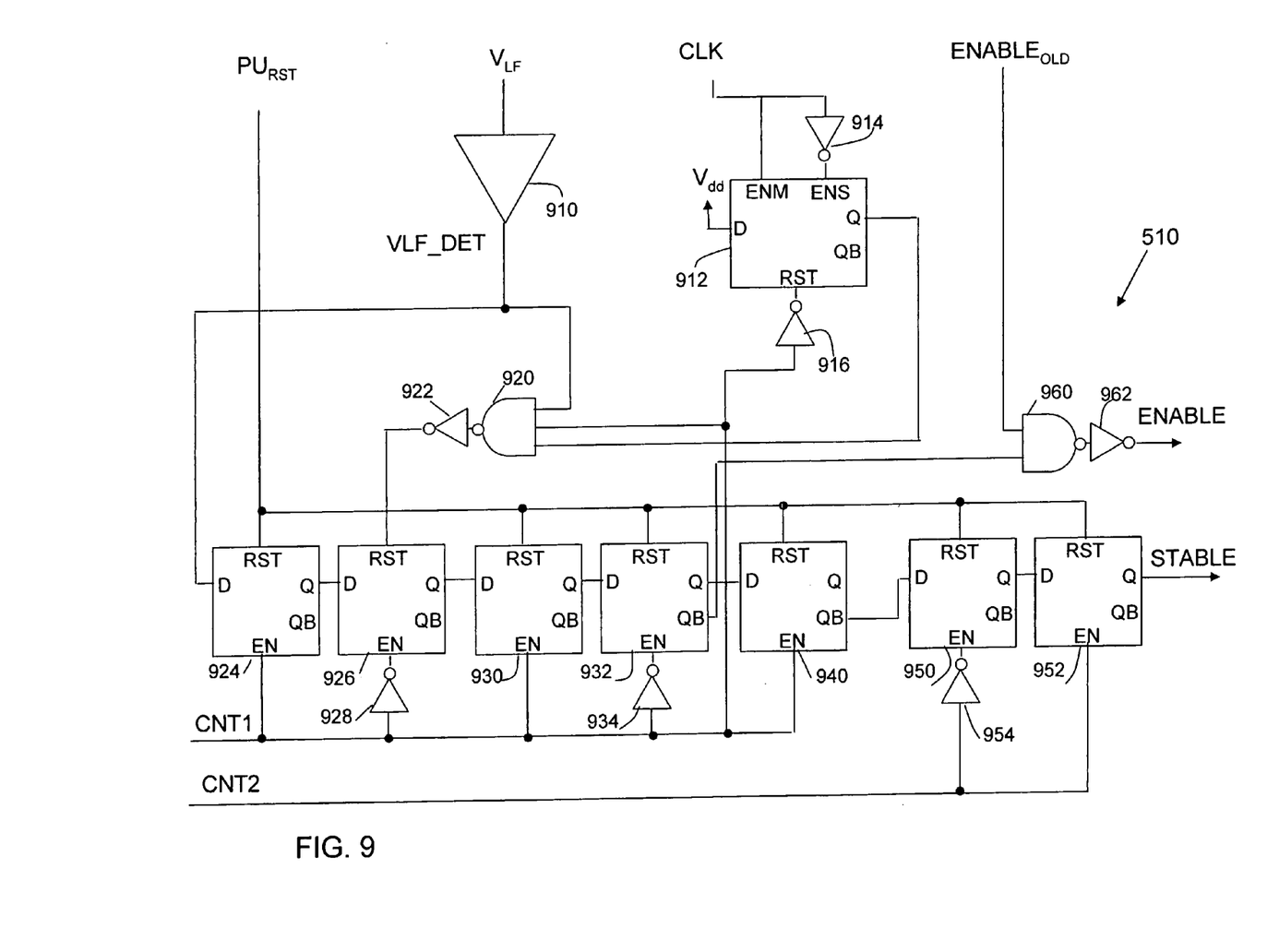
FIG. 9 is a schematic diagram of an implementation of the control circuit of FIG. 5.

Turning now to FIG. 9, an example of the circuitry that can be used to implement control circuit 510 can be seen. Loop control voltage $V_{LF}$ is applied to the input of an analog comparator 910. Analog comparator 910 compares to control voltage $V_{LF}$ to a predetermined threshold. The output of comparator 910 is the signal VLF_DET shown in FIGS. 6, 7, and 8. Comparator 910 is constructed of circuitry as known in the art.

Flip-flop 912 is used as a pulse detector. Flip-flop 912 has two enable inputs denoted ENM and ENS. The inputs ENM and ENS are edge triggered. For the signal at the D input of flip-flop 912 to be clocked through to the Q output, both of the inputs ENM and ENS must experience a rising edge. As shown in FIG. 9 ENM is wired to the CLK output of phase locked loop 210. The input ENS is wired to the CLK output of phase locked loop 210 through an inverter 914. Input ENM experiences a rising edge when the CLK input experiences a rising edge. The input ENS experiences a rising edge when CLK has a falling edge.

In other words, for the D input of flip-flop 912 to be clocked through to the Q output, CLK must have a complete pulse.

The D input of flip-flop 912 is wired to $V_{dd}$. This configuration represents a permanent high signal at input D. For this logical high signal to be clocked to the Q output the CLK of phase locked loop 210 must output a complete pulse.

Flip-flop 912 also has a reset input, RST. The RST input is connected through inverter 916 to the CNT1 signal. As described above, CNT1 is derived by counting pulses of the signal XTAL. The reset input of flip-flop 912 will be asserted when CNT1 is low. While CNT1 is low, flip-flop 912 will not produce an output. When CNT1 goes high, the reset input of flip-flop 912 will go low. In this state, flip-flop 912 will produce an output if it experiences both a rising and a falling edge of the CLK output of phase locked loop 210. If both a rising and a falling edge are not experienced while CNT1 is high, flip-flop 912 will be reset until the next time when CNT1 goes high. In this way, the Q output of flip-flop 912 is high to indicate that at least one pulse was detected while CNT1 was high.

Both the output of comparator 910 and flip-flop 912 are provided to NAND gate 920. A third input to NAND gate 920 comes from CNT1. As described above in connection with FIGS. 6, 7, and 8, the state of phase locked loop 210 is checked when clock CNT1 is in a high state. When CNT1 is high and flip-flop 912 indicates a pulse was detected in the CLK signal and comparator 910 indicates that control voltage $V_{LF}$ is above its minimum operating threshold, the output of NAND gate 920 will be low. The output of NAND gate 920 indicates a normal operating condition has been detected. The output of NAND gate 920 is connected to inverter 922. The output of inverter 922 is connected in turn to the reset input of latch 926.

Various latch circuits are shown in FIG. 9. Numerous designs are possible for a latch. In the illustrated embodiment, each latch has a D input and a Q output and a control input, labeled EN. The enable input is edge triggered on the rising edge of a signal connected to it. Upon the rising edge of a signal connected to the EN input, the value at the D input appears at the Q output. Upon the falling edge of a signal connected to the EN input, the value at the D input is stored in the latch and appears at the Q output. Each latch also has a QB output, which is the logical inverse of the Q output. Further, each latch has a reset input, denoted RST. When the reset input is placed in a logical high state, the latch is reset, meaning it is forced to a state in which a logical low value is stored in the latch and appears at the Q output.

When the output of NAND gate 920 indicates a normal operating condition has been detected, the reset input to latch 926 is high. Conversely, when the output of NAND gate 920 is not indicating a normal operating state, latch 926 will never be reset, indicating the loop is in an invalid operating state. Therefore, when CNT1 is high and flip-flop 912 detects a pulse and comparator 910 detects sufficient loop control voltage, latch 926 is held in a reset state and the output is cleared. Otherwise, latch 926 is enabled to clock the value at its D input to its Q output.

The D input of latch 926 is connected to the Q output of latch 924. The D input of latch 924 is connected to the output of comparator 910. As described above, when sufficient loop control voltage is detected the output of comparator 910 is high. The value provided at the Q output of latch 924 will be a logic high when sufficient loop voltage is present and latch 924 is clocked. The reset input to latch 924 is connected to the signal PURST, which holds the Q output of latch 924 low unless the supply voltage reaches a sufficient value.

The enable inputs of latches 924 and 926 are both connected to CNT1. The enable input of latch 926 is connected to an inverter. Therefore, latch 924 will store the value on its D input on the rising edge of a pulse of CNT1 and latch 926 will store the value on its D input on the falling edge.

Combining all of these condition, the Q output of latch 926 is asserted low for any interval, such as $T_2$, $T_3$, and $T_4$ . . . , if the following conditions are met during the interval:
the supply voltage exceeds a thereshold, as indicated by the $PU_{RST}$ signal;
the loop control voltage exceeds a threshold, as indicated by VLF_DET;
a complete pulse of CLK is detected.
Otherwise, the Q output will be high.

The Q output of latch 926 is passed to the D input of latch 930. Latches 930 and 932 also work in a pair. Latch 930 has its enable input clocked by CNT1 and latch 932 is clocked by CNT1 passing through an inverter 934. In this way latch 930 stores the value on its D input on the rising edge of CNT1 and latch 932 stores the value at its D input on the falling edge. As with latch 924 both latches 930 and 932 have their reset inputs connected to PURST. Therefore, their outputs are held logically low until a predetermined value corresponding to a valid supply voltage has been detected. When not held low, latches 930 and 932 pass through the output of latch 926 with a delay of one period of CNT1.

The QB output of latch 932 is used in the generation of the ENABLE signal. The signal QB is the logical inverse of the signal Q out of latch 932 and will initially be high. The QB output of latch 932 is connected to NAND gate 960. The second input of NAND gate 960 comes from the ENABLE$_{OLD}$ signal. ENABLE$_{OLD}$ represents an ENABLE signal as was in the prior art that is asserted a predetermined time after a valid supply voltage is detected powering phase locked loop 210. Because the QB output of latch 932 will initially be a logic high, NAND gate 960 will pass the ENABLE$_{OLD}$ signal. This signal will be inverted at inverter 962 and provided at the ENABLE output of control circuit 510.

The D output of latch 932 is passed to latch 940. Latch 940 is enabled by the rising edge of CNT1. It is also reset by the signal PURST. The QB output of latch 940 passes to latch pair 950 and 952. Latches 950 and 952 are clocked by CNT 2. Latch 950 is clocked by the falling edge of CNT2 and latch 952 is clocked on the rising edge. The output of latch 952 represents the stable output of control circuit 910. These latches ensure that stable signal is not asserted until some period of delay after a valid operating state of phase locked loop 210 is detected.

Having thus described several aspects of at least one embodiment of this invention, it is to be appreciated various alterations, modifications, and improvements will readily occur to those skilled in the art.

For example, some of the signals are shown as single wires, but different numbers of wires might be used. One example is the ENABLE signal, which is shown as a single wire. Multiple lines can be used to control whether a device should be enabled or disabled. For example, one line might indicate that the device is enabled while another might indicate that the device should be disabled. Preferably, where multiple lines are used, all combinations of values on these lines correspond to a specific operation of the device.

Also, control circuitry to reset the phase locked loop upon powerup was described. Such circuitry might be disabled once the clock generation circuit is successfully powered up. Alternatively, the control circuit can continue to operate and reset the phase locked loop at any time an abnormal operating condition is detected.

Abnormal operating conditions might be detected, for example, if the phase locked loop fails to settle into a locked condition following a power dip or a change in control.

As another variation, phase locked loop 210 is shown to have an enable input that can enable or disable phase detector 218, charge pump 216, loop filter 214 and VCO 212. Variations are possible in which not every sub-circuit within phase locked loop 210 needs to be disabled. Also, each of these sub-circuits might operate differently when disabled. For example, disabling phase detector 218 might prevent it from generating an output signal but disabling loop filter 214 might place it in a state where any charge stored within the filter is dissipated.

Further, variations in the timing control signals are possible. The examples show a CNT2 signal that has a period that is twice as long as CNT1. This ratio of periods is an example only and many other time relationships are possible. As another example, FIG. 7 shows that the enable signal is de-asserted for one period of CNT2 to reset PLL 210. In the described embodiment any amount of time sufficient to discharge the analog elements in the loop is acceptable. Further, if the loop is reset using a technique other than waiting for charge to dissipate, other timing may be used.

Further, the term "phase locked loop" is sometimes used generally referred to a loop in which the output of a VCO is compared, directly or indirectly, to a reference input signal and the error signal is used to adjust the control input of the VCO. In some instances, the term is used to more specifically refer to the control algorithm used in the negative feedback loop, which might be dictated by the "order" of the phase detector. If a phase detector of different order is used, the loop might be referred to by a different name, such as a "delay locked loop." However, unless context indicates otherwise, in connection with the description of the invention, "phase locked loop" is used in the most general sense.

Further, many circuits designs can achieve the desired function. Some latches are shown in pairs, such as 924 and 926 or 930 and 932 or 950 and 952. Each latch pair could be replaced by a flip-flop.

Such alterations, modifications, and improvements are intended to be part of this disclosure, and are intended to be within the spirit and scope of the invention. Accordingly, the foregoing description and drawings are by way of example only.

What is claimed is:

1. An electronic device having a clock generation circuit, the clock generation circuit comprising:
   a) a phase locked loop generating a control signal and having a clock output and an enable input enabling operation of the phase locked loop when a first value is applied to the enable input and disabling the phase locked loop when a second value is applied to the enable input, and;
   b) a control circuit having an output connected to the enable input, the control circuit comprising:
      i) a first sub-circuit, receiving the control signal and producing an output indicating the condition of the control signal;
      ii) a second sub-circuit, coupled to the clock output of the phase locked loop, that detects a pulse and produces an output indicating that a pulse is present during a first interval of time; and
      iii) a third sub-circuit, having inputs coupled to the first sub-circuit and the second sub-circuit and an enable output, the third sub-circuit, when at least one of the control voltage and the pulse are not detected at the end of the first interval of time, provides an enable input to the phase locked loop with the second value and maintains the enable input with the second value for a second interval of time and thereafter provides the enable input the first value for at least a third interval of time.

2. The electronic device of claim 1 wherein the output of the second sub-circuit indicates a pulse when the second sub-circuit detects both a rising edge in the clock input and a falling edge during the first interval of time.

3. The electronic device of claim 1 additionally comprising a oscillator, and the first interval is defined by counting a predetermined number of oscillations of the oscillator.

4. The electronic device of claim 1 wherein the first sub-circuit produces an output indicating the control signal exceeds a predetermined threshold.

5. The electronic device of claim 1 wherein the third sub-circuit provides an output signal termed the stable output, with a value indicating the phase locked loop is settled when, at the end of the first interval, both the control voltage and the pulse are detected.

6. The electronic device of claim 5 additionally comprising a microprocessor core having a control input, the enable input of the microprocessor core coupled to the stable output of the third sub-circuit, the microprocessor core being enabled in response to the control input having the value indicating the phase locked loop is settled.

7. The electronic device of claim 5 wherein the third sub-circuit provides the stable output with a value indicating the phase locked loop is settled when the pulse and the control voltage are detected concurrently.

8. The electronic device of claim 1 wherein the first sub-circuit comprises an analog comparator.

9. The electronic device of claim 8 wherein the second sub-circuit consists essentially of digital logic.

10. The electronic circuitry of claim 9 wherein the second sub-circuit comprises a flip-flop having two edge triggered inputs coupled to the output of the phase locked loop, with one of said inputs being the logical inverse of the other of said inputs.

11. The electronic device of claim 1 additionally comprising a fixed oscillator and a fourth sub-circuit having an input coupled to the supply voltage for the phase locked loop and an output indicating that a predetermined time has passed since the supply voltage exceed a threshold.

12. A method of operating a timing circuit having a phase locked loop, the method comprising:
 a) during a first interval, checking whether a control signal in the phase locked loop is between a maximum allowed value and a minimum allowed value;
 b) when the control signal in the phase locked loop is above a maximum allowed value or below a minimum allowed value, disabling the phase locked loop for a second interval; and
 c) when the control signal in the phase locked loop is below a maximum allowed value and above a minimum allowed value, indicating that the output of the phase locked loop is stable.

13. The method of operating a timing circuit having a phase locked loop of claim 12 wherein checking whether the control signal in the phase locked loop is between a maximum allowed value and a minimum allowed value comprises:
 a) comparing the control signal to a threshold representing the minimum allowed value; and
 b) detecting an oscillation at the output of the phase locked loop.

14. The method of operating a timing circuit having a phase locked loop of claim 13 wherein detecting an oscillation comprises using digital logic circuitry to detect at least one pulse during the first interval.

15. The method of operating a timing circuit having a phase locked loop of claim 12 additionally comprising, after the second interval, re-enabling the phase locked loop and repeating the method of claim 12.

16. The method of operating a timing circuit having a phase locked loop of claim 15 additionally comprising, iteratively repeating the method of claim 15 until the output is indicated to be stable.

17. The method of operating a timing circuit having a phase locked loop of claim 12 wherein the timing circuit is part of an electronic device having a microprocessor core and the method further comprises selectively enabling the microprocessor core in response to an indication that the phase locked loop is stable.

18. The method of operating a timing circuit having a phase locked loop of claim 12 wherein the phase locked loop comprises a voltage controlled oscillator with a control input and checking whether the control signal in the phase locked loop is between a maximum allowed value and a minimum allowed value comprises comparing the control input of the voltage controlled oscillator to a threshold.

19. The method of operating a timing circuit having a phase locked loop of claim 12 wherein the first interval and the second interval are determined by counting pulses of an external clock.

20. The method of operating a timing circuit having a phase locked loop of claim 12 wherein the first interval begins a predetermined time after the supply voltage to the phase locked loop exceeds a threshold.

21. A method of operating a timing circuit comprising a phase locked loop comprising:
 a) during a first interval, detecting whether a control voltage in the phase locked loop is above a threshold and at least one pulse is produced from the output of the phase locked loop;
 b) when the control voltage in the phase locked loop is not above a threshold and at least one pulse is produced from the output of the phase locked loop, disabling the phase locked loop for a second interval;
 c) when the control voltage in the phase locked loop is above a threshold and at least one pulse is produced from the output of the phase locked loop, producing an indication that the output of the phase locked loop is stable.

22. The method of operating a timing circuit having a phase locked loop of claim 21 wherein detecting at least one pulse during the first interval comprises using digital circuitry to detect the pulse.

23. The method of operating a timing circuit having a phase locked loop of claim 21 additionally comprising, after the second interval, re-enabling the phase locked loop and repeating the method of claim 21.

24. The method of operating a timing circuit having a phase locked loop of claim 23 additionally comprising, iteratively repeating the method of claim 23 until the output is indicated to be stable.

25. The method of operating a timing circuit having a phase locked loop of claim 21 wherein the timing circuit is part of an electronic device having a microprocessor core and the method further comprises selectively enabling the microprocessor core in response to an indication that the phase locked loop is stable.

26. The method of operating a timing circuit having a phase locked loop of claim 21 wherein the first interval and the second interval are determined by counting pulses of an external clock.

27. The method of operating a timing circuit having a phase locked loop of claim 21 wherein the first interval begins a predetermined time after the supply voltage to the phase locked loop exceeds a threshold.

* * * * *